(12) United States Patent
Yang et al.

(10) Patent No.: US 9,587,121 B2
(45) Date of Patent: Mar. 7, 2017

(54) FUNCTIONAL MATERIAL AND PREPARATION METHOD THEREOF, RESIN COMPOSITION, FILM, AND DISPLAY DEVICE

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Jiuxia Yang, Beijing (CN); Feng Bai, Beijing (CN); Jiantao Liu, Beijing (CN)

(73) Assignees: BOE Technology Group Co., Ltd., Beijing (CN); Beijing BOE Optoelectronics Technology Co., Ltd., Beijing (CN)

(*) Notice: Subject to any disclaimer, the term of this patent is extended or adjusted under 35 U.S.C. 154(b) by 0 days.

(21) Appl. No.: 14/760,914

(22) PCT Filed: Nov. 21, 2014

(86) PCT No.: PCT/CN2014/091856
§ 371 (c)(1),
(2) Date: Jul. 14, 2015

(87) PCT Pub. No.: WO2016/015411
PCT Pub. Date: Feb. 4, 2016

(65) Prior Publication Data
US 2016/0251526 A1    Sep. 1, 2016

(30) Foreign Application Priority Data
Jul. 29, 2014 (CN) .......................... 2014 1 0366767

(51) Int. Cl.
| | |
|---|---|
| *C08F 2/46* | (2006.01) |
| *C08F 2/50* | (2006.01) |
| *C08G 61/04* | (2006.01) |
| *C09D 7/12* | (2006.01) |
| *C09C 1/40* | (2006.01) |
| *C09C 3/10* | (2006.01) |
| *C09C 1/36* | (2006.01) |
| *C08G 69/26* | (2006.01) |
| *G03F 7/004* | (2006.01) |
| *G03F 7/027* | (2006.01) |
| *C09D 4/00* | (2006.01) |
| *C09D 5/00* | (2006.01) |
| *C09D 7/06* | (2006.01) |

(52) U.S. Cl.
CPC .......... *C09D 7/1225* (2013.01); *C08G 69/26* (2013.01); *C09C 1/36* (2013.01); *C09C 1/40* (2013.01); *C09C 3/10* (2013.01); *C09D 4/00* (2013.01); *C09D 5/00* (2013.01); *C09D 7/06* (2013.01); *G03F 7/004* (2013.01); *G03F 7/027* (2013.01)

(58) Field of Classification Search
CPC .......... C09D 7/1225; C09D 7/06; C09D 4/00; C09D 5/00; C09C 3/10
USPC ........... 522/39, 33, 6, 71, 189, 184, 1; 520/1
See application file for complete search history.

(56) References Cited

U.S. PATENT DOCUMENTS 4,759,987 A * 7/1988 Mizobe .................... C08J 3/215
                                                              427/216
8,456,733 B2    6/2013 Fontana et al.

FOREIGN PATENT DOCUMENTS

| CN | 103555003 | * | 2/2014 |
|---|---|---|---|
| CN | 103555003 A | | 2/2014 |
| CN | 103739205 A | | 4/2014 |
| JP | H 1-135868 A | | 5/1989 |
| WO | 2007048721 A1 | | 5/2007 |

OTHER PUBLICATIONS

Feng et al, CN 103555003 Machine translation, Feb. 5, 2014.*
Chinese Office Action of Chinese Application No. 201410366767.6, mailed Jul. 7, 2015 with English translation.
International Search Report with Notice of Transmittal of the International Search Report of PCT/CN2014/091856 in Chinese, mailed Apr. 22, 2015.
Written Opinion of the International Searching Authority of PCT/CN2014/091856 in Chinese with English translation, mailed Apr. 22, 2015.
Third Chinese Office Action of Chinese Application No. 201410366767.6, mailed Jun. 6, 2016 with English translation.
Second Chinese Office Action of Chinese Application No. 201410366767.6, mailed Sep. 2, 2015 with English translation.

* cited by examiner

*Primary Examiner* — Ling Choi
*Assistant Examiner* — Jessica E Whiteley
(74) *Attorney, Agent, or Firm* — Collard & Roe, P.C.

(57) ABSTRACT

A functional material and a preparation method thereof, a curable resin composition, a film and a display device are provided. The functional material comprises inorganic powder provided with modifying layer on the surface, the inorganic powder comprising any one or more selected from the group consisting of aluminum oxide, magnesium oxide, zinc oxide, zirconium oxide, silicon dioxide, titanium dioxide, boron oxide, iron sesquioxide, calcium oxide, potassium oxide, sodium oxide, lithium oxide; and the modifying layer being formed by the reaction of a dianhydride and a diamine. The curable resin composition of the present invention contains the above functional material. The film and display device comprise a transparent film layer formed by the curing of the above-mentioned curable resin composition.

7 Claims, 1 Drawing Sheet

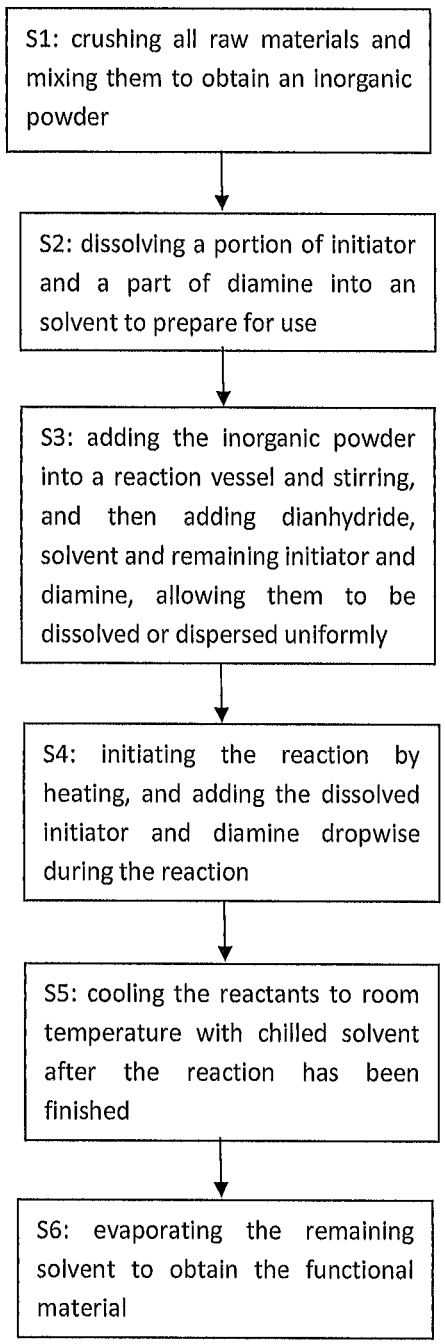

FUNCTIONAL MATERIAL AND PREPARATION METHOD THEREOF, RESIN COMPOSITION, FILM, AND DISPLAY DEVICE

CROSS-REFERENCE TO RELATED APPLICATIONS

This application is the National Stage of PCT/CN2014/091856 filed on Nov. 21, 2014, which claims priority under 35 U.S.C. §119 of Chinese Application NO. 201410366767.6 fled on Jul. 29, 2014, the disclosure of which is incorporated by reference

TECHNICAL FIELD

The present invention relates to the technical field of display, and in particular, to a functional material and a preparation method thereof, a curable resin composition, a film and a display device.

BACKGROUND

With the development of new techniques, various display devices have become widely used in televisions, computers, mobile phones, etc.

However, no matter what type of display devices, liquid crystal display devices, organic light-emitting diode display devices, plasma display devices or others, certain amounts of electromagnetic radiation interference are created by their use, thereby adversely impacting human health.

SUMMARY

The present invention aims to solve the pollution problem caused by the existing display devices, and provides a functional material, which has medical care effects and is environmentally friendly, and a preparation method thereof, a curable resin composition, a film and a display device.

An embodiment used for solving the technical problem of the present invention is a functional material, which comprises an inorganic powder provided with a modifying layer on the surface, wherein the inorganic powder comprises:

any one or more selected from the group consisting of aluminum oxide, magnesium oxide, zinc oxide, zirconium oxide, silicon dioxide, titanium dioxide, boron oxide, iron sesquioxide (iron(III) oxide), calcium oxide, potassium oxide, sodium oxide and lithium oxide; and the modifying layer is formed by the reaction of a dianhydride and a diamine.

For example, the molar ratio of the dianhydride to the diamine used to form the modifying layer is (0.85-1.05):1.

Further preferably, the molar ratio of the dianhydride to the diamine used to form the modifying layer is (0.92-1.05):1.

For example, the dianhydride used to form the modifying layer contain at least one phenyl group, and the diamine used to form the modifying layer contain at least one phenyl group or one six-membered carbon ring other than phenyl group.

Further preferably, the dianhydride used to form the modifying layer is any one selected from the group consisting of pyromellitic dianhydride, trimellitic anhydride, benzophonone dianhydride, diphenyl dianhydride, diphenyl ether dianhydride (i.e. 2,3,3',4'-Diphenyl ether tetracarboxylic acid dianhydride) and 4,4'-(hexafluoroisopropylidene) diphthalic anhydride (i.e. hexafluorodianhydride), and the diamine used to form the modifying layer is any one selected from 3-aminobenzylamine, 2,2'-difluoro-4,4'-(9-fluorenylidene)diphenylamine, 2,2-bis(3-amino-4-hydroxyphenyl)hexafluoropropane, hexahydro-m-xylylene diamine, 1,4-di(aminomethyl)cyclohexane, 2,2-bis[4-(4-aminophenoxy)phenyl]hexafluoropropane, 2,2-bis(3-amino-4-tolyphexafluoropropane, 2,2-bis(3-aminophenyl)hexafluoropropane, 2,2-bis(4-aminophenyl)hexafluoropropane, 2,7-diaminofluorene, m-xylylene diamine and 4,4'-methlene-bis (2-ethyl-6-methylaniline).

For example, the inorganic powder has a particle diameter of 1 to 5000 nm.

An embodiment used for solving the technical problem of the present invention is a method for preparing the above-mentioned functional material, which comprises:

mixing the inorganic powder, the dianhydride, the diamine, an initator and a solvent uniformly; and reacting the dianhydride with the diamine by heating to form the modifying layer on the surface of the inorganic powder.

For example, the mass ratio of the inorganic powder to the products formed by the reaction of the dianhydride and the diamine is (20-1):1.

For example, the heating is carried out in two steps of, specially, heating at 35 to 70° C. for 20 to 40 min; and heating at 70 to 100° C. for 20 to 40 min.

An embodiment used for solving the technical problem of the present invention is a curable resin composition, which comprises:

a curable resin;
a solvent; and
the above-mentioned functional material.

For example, the curable resin comprises acrylic resin and epoxy resin; the curable resin composition further comprises a coupling agent and a wetting and leveling agent; and upon excluding the mass of the modifying layer of the functional material, each component in the curable resin composition has a mass percentage content as follows:

acrylic resin: 1-20%;
epoxy resin: 1-20%;
coupling agent: 1-10%;
wetting and leveling agent: 0.2-5%; and
solvent: 70-90%.

For example, the curable resin comprises a vinyl unsaturated monomer; the curable resin composition further comprises a photoinitiator and a wetting and leveling agent; and upon excluding the mass of the modifying layer of the functional material, each component in the curable resin composition has a mass percentage content as follows:

vinyl unsaturated monomer: 5-35%;
photoinitiator: 0.01-1%;
wetting and leveling agent: 0.2-5%; and
solvent: 60-90%.

For example, upon excluding the mass of the modifying layer of the functional material, the inorganic powder of the functional material in the curable resin composition has a mass percentage content of 0.1 to 2.5% powder.

Preferably, upon excluding the mass of the modifying layer of the functional material, the inorganic powder of the functional material in the curable resin composition has a mass percentage content of 0.1 to 2% powder.

Further preferably, upon excluding the mass of the modifying layer of the functional material, the inorganic powder of the functional material in the curable resin composition has a mass percentage content of 0.1 to 1.8% powder.

Herein, "upon excluding the mass of the modifying layer of the functional material, a certain material in the curable resin composition has a mass percentage content of . . . " means the mass percentage content of the certain material is calculated based on that the total mass of the remaining materials in the curable resin composition upon excluding the modifying layer of the functional material (for example, the remaining materials are the inorganic powder of the functional material, the curable resin, the wetting and leveling agent, the solvent, the coupling agent, the photoinitiator, etc.) is 100%.

An embodiment used for solving the technical problem of the present invention is a film, which comprises a transparent film layer formed by curing the above-mentioned curable resin composition.

An embodiment used for solving the technical problem of the present invention is a display device, which comprises a transparent film layer formed by the curing of the above-mentioned curable resin composition.

The functional material of the present invention can emit far infrared rays and negative ions. After the far infrared rays have been absorbed by a human body, they can resonate and activate water molecules in the body and enhance the binding affinity between the molecules, thereby activating biomacromolecules such as proteins and making organism cells stay in the highest vibration energy level. The heat quantity of the far infrared rays also can be transferred to deeper hypodermal regions and will increase the temperature of the deeper hypodermal regions, thereby expanding capillary vessels, accelerating blood circulations, enhancing the metabolism of each tissue, strengthening tissue regeneration capability, increasing organism immunity and regulating erethisophrenia status. Moreover, the negative ions can decompose and oxidize bacilli and organic substances and have a sterilization effect and an environmental air cleaning effect. Therefore the functional material has medical care effects and is environmentally friendly.

The inorganic powder in the functional material of the present invention has a modifying layer on the surface. The modifying layer enables the inorganic powder to be well blended into the transparent film layer and increase the capability of the inorganic powder to emit far infrared rays and negative ions.

The film and display device of the present invention comprise the transparent film layer formed by the above-mentioned curable resin composition, and thus they can emit far infrared rays and negative ions continuously during the use and are environmentally friendly.

BRIEF DESCRIPTION OF THE DRAWINGS

FIG. 1 is a flow chart of a method for preparing a functional material in an example of the present invention.

DETAILED DESCRIPTION

To make the technical solutions of the present invention to be better understood by a person skilled in the art, the present invention will be described in detail with reference to the figures and the detailed embodiments.

This example provided a functional material and a preparation method thereof.

The functional material comprises inorganic powder provided with a modifying layer on the surface. The inorganic powder comprises any one or more selected from a group consisting of aluminum oxide, magnesium oxide, zinc oxide, zirconium oxide, silicon dioxide, titanium dioxide, boron oxide, iron sesquioxide, calcium oxide, potassium oxide, sodium oxide and lithium oxide; and the modifying layer being formed by the reaction of a dianhydride and a diamine.

Herein, the inorganic powder has a particle size that ranges from the nanometer dimension to the micrometer dimension, specifically between 1 to 5000 nm, preferably between 10 to 500 nm. The particle size can be determined by the Marvin Laser Particle Size Analyzer.

Herein, the dianhydride means a material containing at least two anhydride groups in the molecular structure; and the diamine means a material containing at least two amine groups or amino groups in the molecular structure.

Herein, for instance, the dianhydride contains at least one phenyl group and preferably is selected from the group consisting of pyromellitic dianhydride, trimellitic anhydride, benzophonone dianhydride, diphenyl dianhydride, diphenyl ether dianhydride and 4,4'-(hexafluoroisopropylidene) diphthalic anhydride.

Herein, for instance, the diamine contains at least one phenyl group or one six-membered carbon ring other than phenyl group and preferably is selected from the group consisting of 3-aminobenzylamine, 2,2'-difluoro-4,4'-(9-fluorenylidene)diphenylamine, 2,2-bis(3-amino-4-hydroxyphenyl)hexafluoropropane, hexahydro-m-xylylene diamine, 1,4-di(aminomethyl)cyclohexane, 2,2-bis[4-(4-aminophenoxy)phenyl]hexafluoropropane, 2,2-bis(3-amino-4-tolyl) hexafluoropropane, 2,2-bis(3-aminophenyl)hexafluoropropane, 2,2-bis(4-aminophenyl)hexafluoropropane, 2,7-diaminofluorene, m-xylylene diamine and 4,4'-methlene-bis (2-ethyl-6-methylaniline).

Herein, for instance, the molar ratio of the dianhydride to the diamine is (0.85-1.05):1, preferably is (0.92-1.05):1.

It was found that the modifying layer formed by the reaction of the dianhydride and the diamine can optimally improve the properties of the inorganic powder.

The functional material of this example can emit far infrared rays and negative ions. After being absorbed by a human body, the far infrared rays can resonate and activate water molecules in the body and enhance the binding affinity between the molecules, thereby activating biomacromolecules such as proteins and making organism cells stay in the highest vibration energy level. The heat quantity of the far infrared rays also can be transferred to deeper hypodermal regions and will increase the temperature of the deeper hypodermal regions, thereby expanding capillary vessels, accelerating blood circulation, enhancing the metabolism of each tissue, strengthening tissue regeneration capability, increasing organism immunity and regulating erethisophrenia status. Moreover, the negative ions can decompose and oxidize bacilli and organic substances and have a sterilization effect and an environmentally air cleaning effect. Therefore the functional material of this example has medical care effects and is environmentally friendly.

The method for preparing the above-mentioned functional material comprises: mixing the inorganic powder, the dianhydride, the diamine, an initator and a solvent uniformly; and heating to react the dianhydride with the diamine to form the modifying layer on the surface of the inorganic powder.

Specifically, as shown in FIG. 1, the above preparation method can comprise:

S01. crushing each raw material into powder in the presence of a dispersant and mixing the powder well in a ratio, or mixing all raw materials well in a ratio and then crushing them, to obtain an inorganic powder.

Herein, the dispersant can be selected from BYK 161 produced by BYK Corp., German, Solsperse 32500 and Solsperse 22000 produced by Lubrizol Corp, and other common dispersants; and the crushing can be carried out by conventional means such as ball milling, grinding, etc. Because the inorganic powder can be formed by known methods, those methods need not to be described in detail herein.

S02. dissolving ¼-⅓ of the total amount of the initiator and ¼-⅓ of the total amount of the diamine into the solvent to prepare for use.

Herein, the ratio of the mass of the inorganic powder to the mass of the products formed by the reaction of the dianhydride and the diamine is (20-1):1.

That is, the amounts of the dianhydride and the diamine are determined in the following way: it is provided that the dianhydride is reacted completely with the diamine to obtain a product, i.e. the modifying layer in practice, if the mass of the products is 1, then the mass of the inorganic powder is between 1 to 20. With these amounts, it can be ensured that a modifying layer of an appropriate thickness is formed on the inorganic powder.

Herein, an initiator is used for initiating the reaction and, for instance, is nitrogenous initiator, preferably any one of azodiisobutyronitrle, 2,2'-diazo-(2,4-dimethylvaleronitrle), dimethyl azodiisobutyrate and azodiisovaleronitrle.

Herein, the solvent can be selected from the group consisting of conventional organic solvents, such as a fatty alcohol, ethylene glycol ether, ethyl acetate, methyl ethyl ketone, methyl isobutyl ketone, monomethyl ether ethylene glycol ester, y-butyrolactone, 3-ethyl ether ethyl propionate, butyl carbitol, butyl carbitol acetate, propylene glycol monomethyl ether, propylene glycol monomethyl ether acetate, cyclohexane, xylene, isopropyl alcohol and the like. The solvent is used only for dispersing those raw materials. Thus propylene glycol monomethyl ether acetate is used as the solvent during the preparation of the functional material in all examples.

S03. adding the inorganic powder into a reaction vessel, such as a four-necked bottle, stirring, vibrating, shaking or the like, and then adding dianhydride, solvent and remaining initiator and diamine, allowing them to be dissolved or dispersed uniformly.

S04. heating to initiate the reaction, for instance, the heating is carried out in two steps, which may specifically comprise firstly heating at 35 to 70° C. for 20 to 40 min; and then heating at 70 to 100° C. for 20 to 40 min.

During heating, the dianhydride can be reacted with the diamine to form a modifying layer on the surface of the inorganic powder. Herein, the heating carried out in steps is mainly for preventing the reaction from excessively severe.

During the reaction, the above solution in which the initiator and the diamine are dissolved is added dropwise into the four-necked bottle in order to prevent the reaction from being excessively severe.

Herein, for instance, the reaction in this step is carried out under the protection of nitrogen gas, and for instance, stirring is maintained during the reaction.

Herein, the solvent in each step is used in an amount such that the materials can be dispersed uniformly or dissolved therein, while the amount of the initiator is such that the reaction can be initiated. These amounts can be adjusted by a person skilled in the art according to practical situations and need not to be described in detail herein. Generally, the inorganic powder, the initiator, and the solvent (the total amount) have a mass ratio of 1:(0.25-0.4):(1-1.5). In all examples, during the course of the preparation of the functional materials, the inorganic powder, the initiator and the solvent have a mass ratio of 1:0.3:1.4.

S05. cooling the reactants to a room temperature of about 10 to 30° C. with chilled solvent after the reaction has been finished.

S06. evaporating the remaining solvent or separating the powder therefrom, to obtain the inorganic powder which are provided with modifying layer, namely the functional material.

Of course, it should be understood that many changes may be made to the above preparation method. For example, all of the dianhydride, the diamine, the initiator and others can be dissolved in the solvent at one time. Another example is that heating can be carried out in one step. In summary, the preparation method is feasible as long as the dianhydride and the diamine can be reacted to form a modifying layer on the surface of the inorganic powder.

This example further provides a curable resin composition which comprises a curable resin, a solvent and the above-mentioned functional material.

The curable resin composition can be cured to form a transparent film layer which contains the above-mentioned functional material. The functional material within the transparent film layer can emit far infrared rays and negative ions continuously, thereby improving the environment.

Upon excluding the mass of the modifying layer of the functional material, the inorganic powder of the functional material in the curable resin composition has a mass percentage content of 0.1 to 2.5%, preferably 0.1 to 2%, more preferably 0.1 to 1.8%.

That is, when the total mass of the remaining materials in the curable resin composition upon excluding of the modifying layer of the functional material (the remaining materials can comprise the inorganic powder of the functional material, the curable resin, the wetting and leveling agent, the solvent, the coupling agent, the photoinitiator, etc.) is 100%, the amount of the inorganic powder of the functional material is as stated above.

In the curable resin composition, the curable resin is the main material for forming the transparent film layer. According to the type thereof, the curable resin composition can be classified as two types, thermo-setting and UV-setting.

In the thermo-setting curable resin composition, the curable resin comprises acrylic resin and epoxy resin, and the composition further comprises a coupling agent and a wetting and leveling agent. Upon excluding the mass of the modifying layer of the functional material, each component in the curable resin composition has a mass percentage content as follows:

Inorganic powder: 0.1-2.5%, more preferably 0.1-2% or 0.1-1.8%;
acrylic resin: 1-20%;
epoxy resin: 1-20%;
coupling agent: 1-10%;
wetting and leveling agent: 0.2-5%; and
solvent: 70-90%.

Herein, the acrylic resin may be substance containing an acrylic group such as methyl acrylate resin, ethyl acrylate resin, methyl 2-methacrylate resin, ethyl 2-methacrylate resin, polyester acrylate, polyurethane acrylate, epoxy acrylate resin and the like. The content thereof is 5-20%, preferably 5-15%.

Herein, the epoxy resin may be aliphatic epoxy resin, bisphenol A type epoxy resin, glycidyl ester epoxy resin, heterocyclic epoxy resin, etc. For instance, the content thereof is 5-20%, preferably 5-15%.

Herein, the coupling agent is used for initiating the crosslinking reaction of the curable resin to cure the resin and may be silane coupling agent, such as azido silane, phenoxy silane, vinyl silane, amino silane, epoxy silane, mercapto silane, methacryloyloxy silane, etc. For instance, the content thereof is 1-8%, preferably 1-5%.

The wetting and leveling agent is used to improve the leveling property of the composition, and may be an organosilicon wetting and leveling agent, fluorocarbon-modified polyacrylate wetting and leveling agent, acrylic wetting and leveling agent, etc.

The solvent is used to dissolve or disperse other components to form a uniform and stable system, and may be a conventional organic solvent, such as ketone, ester, ether, aliphatic hydrocarbon, cyclic alkane compounds, aromatic hydrocarbon, etc.

In the UV-setting curable resin composition, the curable resin comprises a vinyl unsaturated monomer, and the curable resin composition further comprises a photoinitiator and a wetting and leveling agent. Upon excluding the mass of the modifying layer of the functional material, each component in the curable resin composition has a mass percentage content as follows:

inorganic powder: 0.1-2.5%, more preferably 0.1-2% or 0.1-1.8%;
vinyl unsaturated monomer: 5-35%;
photoinitiator: 0.01-1%;
wetting and leveling agent: 0.2-5%; and
solvent: 60-90%.

Herein, the vinyl unsaturated monomer means an unsaturated monomer substance containing a vinyl group, and may be vinyl chloride, styrene, methyl methacrylate, maleimide, butadiene, methyl acrylate, epoxyacrylate, bisphenol A type methyl epoxyacrylate, etc. For instance, the amount thereof is 5-30%, preferably 5-25%.

The photoinitiator can initiate a crosslinking reaction upon UV irradiation to cure the vinyl unsaturated monomer to form a transparent film layer, and specifically, may be a-aminoketone photoinitiator, such as the initiators of models Irgacure 907, Igracure 369 and Irgacure 1300; acylphosphine oxide photo initiator, such as the initiators of models Irgacure 819, Irgacure 819DW, Irgacure 2010, Darocur TPO and Darocur 4265; α-hydroxyketone photoinitiator, such as the initiators of models Darocur 1173, Irgacure 184, Irgacure 2959, Irgacure 500 and Irgacure 1000; and benzoylformate photoinitiator, such as the initiators of models Darocur mbf and Irgacure 754.

The wetting and leveling agent is used to improve the leveling properties of the composition, and may be an organosilicon wetting and leveling agent, a fluorocarbon-modified polyacrylate wetting and leveling agent, an acrylic wetting and leveling agent, etc.

The solvent is used to dissolve or disperse other components to form a uniform and stable system, and may be a conventional organic solvent, such as ketone, ester, ether, aliphatic hydrocarbon, cyclic alkane compounds, aromatic hydrocarbon, etc.

Of course, it should be understood that other substances may be contained in the above-mentioned curable resin composition, such as other types of curable resins, other additives, such as deformer, etc., other initiators, etc.

A functional material of each example is produced by the above preparation method according to the parameters in the following table.

After that, thermo-setting curable resin compositions are produced from the obtained functional materials according to the parameters in the following table. During the preparation, a specific material adding sequence or a specific mixing method is not required as long as all components are mixed uniformly.

In all examples, all acrylic resins are selected as SB401 type acrylic resin produced by Sartomer Corp.; all epoxy resins are selected as DEN 438 type phenol-formaldehyde epoxy resin produced by DOW Corp., USA; all coupling agents are selected as A186 type of (2-(3,4-epoxycyclohexyl)ethyltrimethoxy-silane); all wetting and leveling agents are selected as BYK 333 type of wetting and leveling agent; and all solvents are selected as propylene glycol methyl ether acetate (PMA).

After then, the curable resin composition is cured to form a transparent film layer. Specially, the curable resin composition is coated on a substrate and heated at the temperature of 180° C. for 20 min for curing to form a transparent film layer, which has a thickness of 1 μm.

Herein, in the curable composition for forming the transparent film layer, the components are conventional components other than the functional material. For the comparability of the results, the components other than the functional material are selected as similar substances.

After that, the infrared radiance ratio of the transparent film layer is measured according to the standard of GB/T 7287-2008, and the amount of negative ions produced by the film layer is measured with an air negative ion tester, such as KEC-900 type produced by KEC Corp., Japan., and then the transmittance of the film layer is measured with a spectrophotometer, such as UV2550 UV-Vis spectrophotometer produced by Shimadzu Corp., Japan. The results are shown in the following table.

TABLE 1 concerned parameters of fuctional materials and thermo-setting curable resin compositions (the contents are in mass part)

| | Item | Example No. 1 | 2 | 3 | 4 | 5 | 6 |
|---|---|---|---|---|---|---|---|
| Inorganic powder | Aluminum oxide | none | 0.01 | 0.014 | 0.019 | 0.024 | 0.029 |
| | Titanium oxide | 0.056 | 31 | 0.337 | 0.449 | 0.561 | 0.673 |
| | Zirconium oxide | 0.023 | none | 0.126 | 0.168 | 0.31 | 0.252 |
| | Silicon dioxide | 0.01 | 0.04 | 0.06 | 0.08 | none | 0.12 |
| | Boron oxide | 0.006 | 0.024 | 0.036 | 0.048 | 0.06 | 0.072 |
| | Iron sesquioxide | 0.003 | 0.012 | 0.018 | 0.024 | 0.045 | 0.036 |
| | Sodium oxide | 0.002 | 0.006 | 0.009 | 0.012 | none | 0.018 |
| | Total amount | 0.1 | 0.4 | 0.6 | 0.8 | 1 | 1.2 |
| | Dianhydride | pyromellitic dianhydride | pyromellitic dianhydride | diphenyl ether dianhydride | pyromellitic dianhydride | diphenyl ether dianhydride | hexafluoro-dianhydride |

TABLE 1-continued concerned parameters of fuctional materials and thermo-setting curable resin compositions (the contents are in mass part)

|  | Diamine | 3-amino benzylamine | hexahydro- m-xylylene diamine | m-xylylene diamine | 3-amino benzylamine | hexahydro- m-xylylene diamine | 3-amino benzylamine |
|---|---|---|---|---|---|---|---|
|  | Ratio of dianhydride to diamine | 0.85 | 0.87 | 0.92 | 1 | 1.05 | 1.05 |
|  | Mass ratio of inorganic powder to products | 20 | 10 | 8 | 15 | 1 | 4 |
|  | Initiator for the preparation of functional material | azodiiso- butyronitrle | azodiiso- butyronitrle | azodiiso- valeronitrle | azodiiso- valeronitrle | azodiiso- butyronitrle | azodiiso- butyronitrle |
|  | Temperature of the first heating step (° C.) | 35 | 40 | 70 | 60 | 50 | 55 |
|  | Duration of the first heating step (min) | 40 | 40 | 20 | 25 | 30 | 25 |
|  | Temperature of the second heating step (° C.) | 75 | 85 | 75 | 80 | 70 | 90 |
|  | Duration of the second heating step (min) | 40 | 25 | 30 | 35 | 40 | 30 |
|  | Amount of acrylic resin | 5 | 15 | 1 | 20 | 3 | 11 |
|  | Amount of epoxy resin | 15 | 10 | 20 | 1 | 3 | 13 |
|  | Amount of coupling agent | 4 | 4 | 1 | 3 | 2 | 5 |
|  | Amount of solvent | 75.7 | 70.1 | 76.9 | 74.2 | 90 | 74.3 |
|  | Amount of wetting and leveling agent | 0.2 | 0.5 | 0.5 | 1 | 1 | 5 |
| Property | Transmittance (%) | 98 | 97 | 96.6 | 96.2 | 96 | 95.9 |
|  | Infrared radiance ratio (%) | 50 | 62 | 83 | 90 | 91 | 92 |
|  | negative ions/cm$^3$ | 120 | 470 | 700 | 920 | 1150 | 1500 |

| | | Example No. | | | | |
|---|---|---|---|---|---|---|
| | Item | 7 | 8 | 9 | 10 | 11 |
| Inorganic powder | Aluminum oxide | 0.033 | 0.038 | 0.043 | 0.048 | 0.06 |
| | Titanium oxide | 0.785 | 0.898 | 1.01 | 1.122 | 1.403 |
| | Zirconium oxide | 0.294 | 0.336 | 0.378 | 0.42 | 0.525 |
| | Silicon dioxide | 0.14 | 0.16 | 0.18 | 0.2 | 0.25 |
| | Boron oxide | 0.084 | 0.096 | 0.108 | 0.12 | 0.15 |
| | Iron sesquioxide | 0.042 | 0.048 | 0.054 | none | 0.074 |
| | Sodium oxide | 0.022 | 0.024 | 0.027 | 0.09 | 0.038 |
| | Total amount | 1.4 | 1.6 | 1.8 | 2 | 2.5 |
| | Dianhydride | hexafluoro- dianhydride | diphenyl ether dianhydride | hexafluoro- dianhydride | hexafluoro- dianhydride | hexafluoro- dianhydride |
| | Diamine | m-xylylene diamine | 2,7- diamino- fluorene | m-xylylene diamine | 2,7- diamino- fluorene | m-xylylene diamine |
| | Ratio of dianhydride to diamine | 1 | 0.9 | 0.9 | 0.85 | 0.92 |
| | Mass ratio of inorganic powder to products | 20 | 1 | 7.5 | 16 | 16 |
| | Initiator for the preparation of functional material | dimethyl azodiiso- butyrate | azodiiso- butyronitrle | azodiiso- valeronitrle | azodiiso- valeronitrle | dimethyl azodiiso- butyrate |
| | Temperature of the first heating step (° C.) | 55 | 65 | 70 | 35 | 30 |
| | Duration of the first heating step (min) | 30 | 35 | 35 | 35 | 20 |
| | Temperature of the second heating step (° C.) | 90 | 100 | 95 | 70 | 80 |
| | Duration of the second heating step (min) | 20 | 20 | 25 | 35 | 40 |
| | Amount of acrylic resin | 10 | 5 | 9 | 9 | 9 |
| | Amount of epoxy resin | 9 | 5 | 10 | 10 | 10 |
| | Amount of coupling agent | 10 | 3 | 5 | 5 | 5 |
| | Amount of solvent | 70 | 82.9 | 73.7 | 73.5 | 73 |
| | Amount of wetting and leveling agent | 1.6 | 2.5 | 0.5 | 0.5 | 0.5 |
| Property | Transmittance (%) | 95.6 | 95.2 | 95 | 94.6 | 93.9 |
| | Infrared radiance ratio (%) | 93 | 94 | 95 | 96 | 99 |
| | negative ions/cm$^3$ | 1590 | 1800 | 2000 | 2200 | 2700 |

A functional material of each example is produced by the above preparation method according to the parameters in the following table. The parameters of the functional material in each example are the same as those in Table 1. After that, UV-setting curable resin compositions are produced from these functional materials according to the parameters in the following table. Herein, a specific material adding sequence or a specific mixing method is not required as long as all components are mixed uniformly.

In all examples, all vinyl unsaturated monomers are selected as dipentaerythritol pentaacrylate (DPHA); all photoinitiators are selected as a photoinitiator Irgacure 907; all wetting and leveling agents are selected as a wetting and leveling agent BYK 333; and all solvents are selected as propylene glycol methyl ether acetate (PMA).

After then, the curable resin composition is cured to form a transparent film layer. Specially, the curable resin composition is coated on a substrate, exposed to a UV light energy of 150 mJ/cm$^2$. Then it is exposed to and heating at the temperature of 200° C. for 15 min for further curing, to form a transparent film layer which has a thickness of 1 μm.

Herein, in the curable composition for forming the transparent film layer, except the functional material, all the other components are conventional components. For the comparability of the results, except the functional material, all the other components are selected as similar substances.

After that, the transparent film layer is tested for infrared radiance ratio according to the standard of GB/T 7287-2008, and is tested for the amount of negative ions produced by using an air negative ion tester, and then is tested for its transmittance by using a light intensity meter. The results are shown in the following table.

TABLE 2 concerned parameters of fuctional materials and UV-setting curable resin compositions (the contents are in mass part)

| | Item | Example No. 12 | 13 | 14 | 15 | 16 | 17 |
|---|---|---|---|---|---|---|---|
| Inorganic powder | Aluminum oxide | none | 0.01 | 0.014 | 0.019 | 0.024 | 0.029 |
| | Titanium oxide | 0.056 | 31 | 0.337 | 0.449 | 0.561 | 0.673 |
| | Zirconium oxide | 0.023 | none | 0.126 | 0.168 | 0.31 | 0.252 |
| | Silicon dioxide | 0.01 | 0.04 | 0.06 | 0.08 | none | 0.12 |
| | Boron oxide | 0.006 | 0.024 | 0.036 | 0.048 | 0.06 | 0.072 |
| | Iron sesquioxide | 0.003 | 0.012 | 0.018 | 0.024 | 0.045 | 0.036 |
| | Sodium oxide | 0.002 | 0.006 | 0.009 | 0.012 | none | 0.018 |
| | Total amount | 0.1 | 0.4 | 0.6 | 0.8 | 1 | 1.2 |
| | Dianhydride | pyromellitic dianhydride | pyromellitic dianhydride | diphenyl ether dianhydride | pyromellitic dianhydride | diphenyl ether dianhydride | hexafluoro-dianhydride |
| | Diamine | 3-amino benzylamine | hexahydro-m-xylylene diamine | m-xylylene diamine | 3-amino benzylamine | hexahydro-m-xylylene diamine | 3-amino benzylamine |
| | Ratio of dianhydride to diamine | 0.85 | 0.87 | 0.92 | 1 | 1.05 | 1.05 |
| | Mass ratio of inorganic powder to products | 20 | 10 | 8 | 15 | 1 | 4 |
| | Initiator for the preparation of functional material | azodiiso-butyronitrle | azodiiso-butyronitrle | azodiiso-valeronitrle | azodiiso-valeronitrle | azodiiso-butyronitrle | azodiiso-butyronitrle |
| | Temperature of the first heating step (° C.) | 35 | 40 | 70 | 60 | 50 | 55 |
| | Duration of the first heating step (min) | 40 | 40 | 20 | 25 | 30 | 25 |
| | Temperature of the second heating step (° C.) | 75 | 85 | 75 | 80 | 70 | 90 |
| | Duration of the second heating step (min) | 40 | 25 | 30 | 35 | 40 | 30 |
| | Amount of vinyl unsaturated monomer | 5 | 35 | 20 | 15 | 10 | 25 |
| | Amount of photointiator | 1 | 0.5 | 0.01 | 0.5 | 0.3 | 1 |
| | Amount of solvent | 88.9 | 62.6 | 77.39 | 82.2 | 88 | 70.8 |
| | Amount of wetting and leveling agent | 5 | 1.5 | 2 | 1.5 | 0.7 | 2 |
| Property | Transmittance (%) | 98.5 | 97.4 | 95.9 | 96.6 | 96.2 | 96.1 |
| | Infrared radiance ratio (%) | 52 | 67 | 84 | 88 | 91 | 91 |
| | negative ions/cm$^3$ | 150 | 400 | 600 | 990 | 1200 | 1550 |

| | Item | Example No. 18 | 19 | 20 | 21 | 22 |
|---|---|---|---|---|---|---|
| Inorganic powder | Aluminum oxide | 0.033 | 0.038 | 0.043 | 0.048 | 0.06 |
| | Titanium oxide | 0.785 | 0.898 | 1.01 | 1.122 | 1.403 |
| | Zirconium oxide | 0.294 | 0.336 | 0.378 | 0.42 | 0.525 |
| | Silicon dioxide | 0.14 | 0.16 | 0.18 | 0.2 | 0.25 |
| | Boron oxide | 0.084 | 0.096 | 0.108 | 0.12 | 0.15 |
| | Iron sesquioxide | 0.042 | 0.048 | 0.054 | none | 0.074 |
| | Sodium oxide | 0.022 | 0.024 | 0.027 | 0.09 | 0.038 |
| | Total amount | 1.4 | 1.6 | 1.8 | 2 | 2.5 |
| | Dianhydride | hexafluoro-dianhydride | diphenyl ether dianhydride | hexafluoro-dianhydride | hexafluoro-dianhydride | hexafluoro-dianhydride |
| | Diamine | m-xylylene diamine | 2,7-diamino-fluorene | m-xylylene diamine | 2,7-diamino-fluorene | m-xylylene diamine |
| | Ratio of dianhydride to diamine | 1 | 0.9 | 0.9 | 0.85 | 0.92 |
| | Mass ratio of inorganic powder to products | 20 | 1 | 7.5 | 16 | 16 |

TABLE 2-continued concerned parameters of fuctional materials and UV-setting curable resin compositions (the contents are in mass part)

| | | | | | | |
|---|---|---|---|---|---|---|
| | Initiator for the preparation of functional material | dimethyl azodiiso-butyrate | azodiiso-butyronitrle | azodiiso-valeronitrle | azodiiso-valeronitrle | dimethyl azodiiso-butyrate |
| | Temperature of the first heating step (° C.) | 55 | 65 | 70 | 35 | 30 |
| | Duration of the first heating step (min) | 30 | 35 | 35 | 35 | 20 |
| | Temperature of the second heating step (° C.) | 90 | 100 | 95 | 70 | 80 |
| | Duration of the second heating step (min) | 20 | 20 | 25 | 35 | 40 |
| | Amount of vinyl unsaturated monomer | 30 | 25 | 20 | 30 | 10 |
| | Amount of photointiator | 0.2 | 0.5 | 0.1 | 1 | 0.3 |
| | Amount of solvent | 66.4 | 68.9 | 75 | 66 | 87.2 |
| | Amount of wetting and leveling agent | 2 | 4 | 3.1 | 1 | 3 |
| Property | Transmittance (%) | 97.6 | 96.2 | 96 | 94.3 | 94.9 |
| | Infrared radiance ratio (%) | 93 | 94 | 94 | 97 | 99 |
| | negative ions/cm$^3$ | 1680 | 1900 | 2040 | 2100 | 2850 |

It can be seen that the transparent film layers in all examples have higher infrared radiance ratios and negative ion concentrations, and higher transmittance. This proves that these layers not only have no influence on display, but also can produce far infrared rays and negative ions to improve the environment.

The inorganic powder of the functional material in this example has a modifying layer on the surface. The modifying layer enables the inorganic powder to be well blended into the transparent film layer and increase the capability of the inorganic powder to emit far infrared rays and negative ions.

This example further provides a film which comprises the transparent film layer formed by curing the above-mentioned curable resin composition.

That is, the above-mentioned curable resin composition is applied onto a substrate by methods such as coating, transfer printing, printing or the like, and then cured to form a transparent film layer. The transparent film layer is taken off and subjected to operations such as rolling, cutting and the like to form a film product such as a rolled film, a flat film or the like.

Herein, the thickness of the transparent film layer can be determined as required, however, can be between 0.005 μm to 1.5 μm. As stated above, the transparent film layer can be formed from the curable resin composition by thermo-curing or UV-curing. The specific curing methods are known and are not restricted in detail herein. In general, in the case of thermo-curing, the heating temperature is between 150° C. to 250° C., and the heating duration is generally between 5 min to 30 min; in the case of UV-curing, the UV light intensity is between 50 mJ/cm$^2$ to 200 mJ/cm$^2$.

The film may further comprise a bonding layer arranged on the transparent film layer (for the convenience of bonding the transparent film layer at desired locations), a release film arranged on the bonding layer, and other structures. These other structures can take known forms, and thus need not to be described in detail herein.

This example further provides a display device which comprises the transparent film layer formed by curing the above-mentioned curable resin composition.

The display device may be any types of display device, such as a liquid crystal display device, an organic light-emitting diode display device, plasma display device and the like, and can be used in any devices with a display function such as televisions, mobile phones, computer displays, tablet computers, electronic books, navigators, ATMs and the like.

The transparent film layer can be arranged in any position with respect to the display device, such as on the inner side, on the shell, etc. Because it is transparent and has no influence on the display, it can be arranged on the outermost side of the light-emitting surface of the display device so as to achieve optimal far infrared rays and negative ion emitting effects.

Specifically, the transparent film layer can be formed into a film product as stated above, and then the film can be laminated on the display device. Alternatively, the transparent film layer can be directly formed onto the surface of the display device as a substrate.

It can be understood that the above embodiments are merely exemplary embodiments which are used to illustrate the principle of the present invention, and the present invention. However, they are not intended to be limited thereto. Various changes and modifications can be made herein for a person skilled in the art without departing from the spirit and essence of the present invention, and those changes and modifications are considered within the scope of protection of the present invention.

The present application claims the priority of the Chinese Patent Application No. 201410366767.6 submitted on Jul. 29, 2014, and the content disclosed in the above Chinese patent application is incorporated by reference as part of this application.

What is claimed is:

1. A functional material, which comprises an inorganic powder provided with a modifying layer on a surface thereof, wherein the inorganic powder comprises:
   any one or more selected from a group consisting of aluminum oxide, magnesium oxide, zinc oxide, zirconium oxide, silicon dioxide, titanium dioxide, boron oxide, iron sesquioxide, calcium oxide, potassium oxide, sodium oxide, and lithium oxide;
   the modifying layer is formed by the reaction of a dianhydride and a diamine;
   wherein:
   the dianhydride used to form the modifying layer contains at least one phenyl group; and
   the diamine used to form the modifying layer contains at least one phenyl group or one six-membered carbon ring other than a phenyl group;

the dianhydride used to form the modifying layer is any one selected from a group consisting of pyromellitic dianhydride, benzophenone dianhydride, diphenyl dianhydride, diphenyl ether dianhydride and 4,4'-(hexafluoroisopropylidene)diphthalic anhydride; and the diamine used to form the modifying layer is any one selected from a group consisting of 3-aminobenzylamine, 2,2'-difluoro-4,4'-(9-fluorenylidene)diphenylamine, 2,2-bis(3-amino-4-hydroxyphenyl)hexafluoropropane, hexahydro-m-xylylene diamine, 1,4-di(aminomethyl)cyclohexane, 2,2-bis[4-(4-aminophenoxy)phenyl]hexafluoropropane, 2,2-bis(3-amino-4-tolyl)hexafluoropropane, 2,2-bis(3-aminophenyl)hexafluoropropane, 2,2-bis(4-aminophenyl)hexafluoropropane, 2,7-diaminofluorene, m-xylylene diamine and 4,4'-methlene-bis(2-ethyl-6-methylaniline).

2. A curable resin composition, which comprises:
a curable resin;
a solvent; and
a functional material which comprises an inorganic powder provided with a modifying layer on a surface thereof, wherein
the inorganic powder comprises any one or more selected from a group consisting of aluminum oxide, magnesium oxide, zinc oxide, zirconium oxide, silicon dioxide, titanium dioxide, boron oxide, iron sesquioxide, calcium oxide, potassium oxide, sodium oxide, and lithium oxide; and
the modifying layer is formed by the reaction of a dianhydride and a diamine.

3. The curable resin composition according to claim 2, wherein: the curable resin comprises acrylic resin and epoxy resin; the curable resin composition further comprises a coupling agent and a wetting and leveling agent; and upon excluding the mass of the modifying layer of the functional material, each component in the curable resin composition has a mass percentage content as follows:
acrylic resin: 1-20%;
epoxy resin: 1-20%;
coupling agent: 1-10%;
wetting and leveling agent: 0.2-5%; and
solvent: 70-90%.

4. The curable resin composition according to claim 2, wherein: the curable resin comprises a vinyl unsaturated monomer; the curable resin composition further comprises a photoinitiator and a wetting and leveling agent; and upon excluding the mass of the modifying layer of the functional material, each component in the curable resin composition has a mass percentage content as follows:
vinyl unsaturated monomer: 5-35%;
photoinitiator: 0.01-1%;
wetting and leveling agent: 0.2-5%; and
solvent: 60-90%.

5. The curable resin composition according to claim 2, wherein:
upon excluding the mass of the modifying layer of the functional material, the inorganic powder of the functional material in the curable resin composition has a mass percentage content of 0.1 to 2.5%.

6. The curable resin composition according to claim 5, wherein:
upon excluding the mass of the modifying layer of the functional material, the inorganic powder of the functional material in the curable resin composition has a mass percentage content of 0.1 to 2%.

7. The curable resin composition according to claim 6, wherein:
upon excluding the mass of the modifying layer of the functional material, the inorganic powder of the functional material in the curable resin composition has a mass percentage content of 0.1 to 1.8%.

* * * * *